United States Patent
Hwang

(10) Patent No.: US 8,148,737 B2
(45) Date of Patent: Apr. 3, 2012

(54) LIGHT EMITTING DEVICE, LIGHT EMITTING DEVICE PACKAGE AND LIGHTING SYSTEM

(75) Inventor: Sung Min Hwang, Anyang-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/909,295

(22) Filed: Oct. 21, 2010

(65) Prior Publication Data

US 2011/0095307 A1  Apr. 28, 2011

(30) Foreign Application Priority Data

Oct. 22, 2009 (KR) .................... 10-2009-0100811

(51) Int. Cl.
*H01L 33/00* (2010.01)
*H01L 21/20* (2010.01)

(52) U.S. Cl. ............... 257/81; 257/79; 257/84; 257/94; 257/98; 257/99; 257/E21.371; 257/E25.032; 257/E29.185; 257/E33.001; 438/39; 438/164; 438/478; 372/81

(58) Field of Classification Search .............. 257/79, 257/81, 84, 94, 98, 99, E21.371, E25.032, 257/E29.185, E33.001; 372/81; 438/39, 438/164, 478
See application file for complete search history.

(56) References Cited

U.S. PATENT DOCUMENTS

| 5,977,565 A * | 11/1999 | Ishikawa et al. ............ 257/81 |
| 2002/0047128 A1 | 4/2002 | Song et al. .................. 257/82 |
| 2008/0308829 A1 | 12/2008 | Liu et al. .................... 257/98 |

FOREIGN PATENT DOCUMENTS

| DE | 101 35 905 A1 | 4/2002 |
| KR | 10-1998-0024435 U | 7/1998 |
| KR | 20080087251 | 10/2008 |
| KR | 1020090048030 | 5/2009 |
| WO | WO 2008/154573 A1 | 12/2008 |

OTHER PUBLICATIONS

Chuang, R. W., et al.; "Improved ESD Properties by Combining GaN-Based Light-Emitting Diode With MOS Capacitor"; Solid State Electronics, Elsevier Science Publishers, Barking, GB, vol. 52, No. 7; Jul. 1, 2008; pp. 1043-1046 (XP022714845).
Korean Office Action dated May 4, 2010 issued in Application No. 10-2009-0100811 (with translation).
Korean Decision to Grant a Patent dated Aug. 18, 2010 issued in Application No. 10-2009-0100811 (with translation).
European Search Report dated Mar. 2, 2011 issued in Application No. 10 18 8567.

* cited by examiner

*Primary Examiner* — Dao H Nguyen
(74) *Attorney, Agent, or Firm* — KED & Associates LLP

(57) ABSTRACT

Disclosed are a light emitting device, a light emitting device package and a lighting system. The light emitting device of the embodiment includes a light emitting structure including a first conductive semiconductor layer, an active layer over the first conductive semiconductor layer, and a second conductive semiconductor layer over the active layer; a dielectric layer over a first region of the first conductive semiconductor layer; a second electrode over the dielectric layer; and a first electrode over a second region of the first conductive semiconductor layer.

6 Claims, 11 Drawing Sheets

[FIG. 1a]
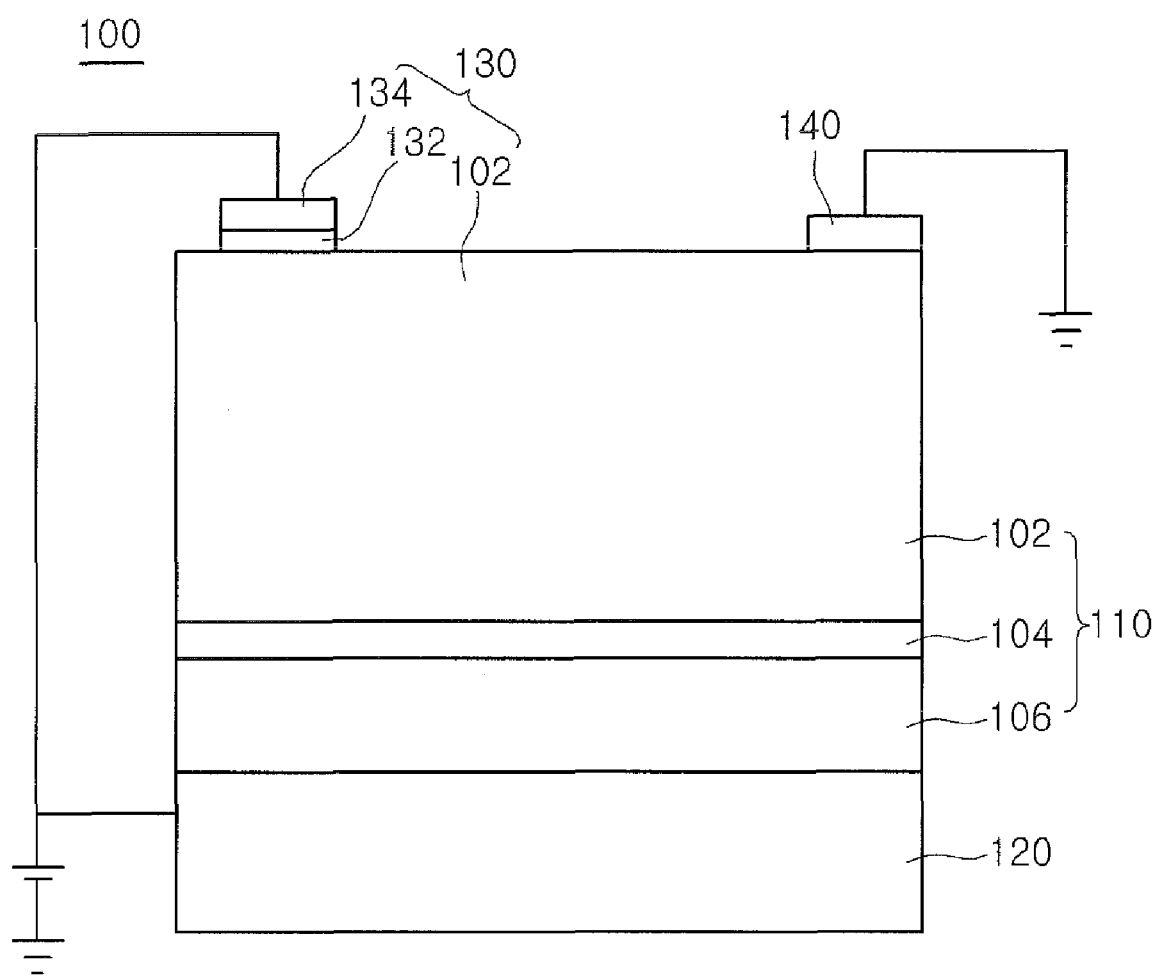

[FIG. 1b]
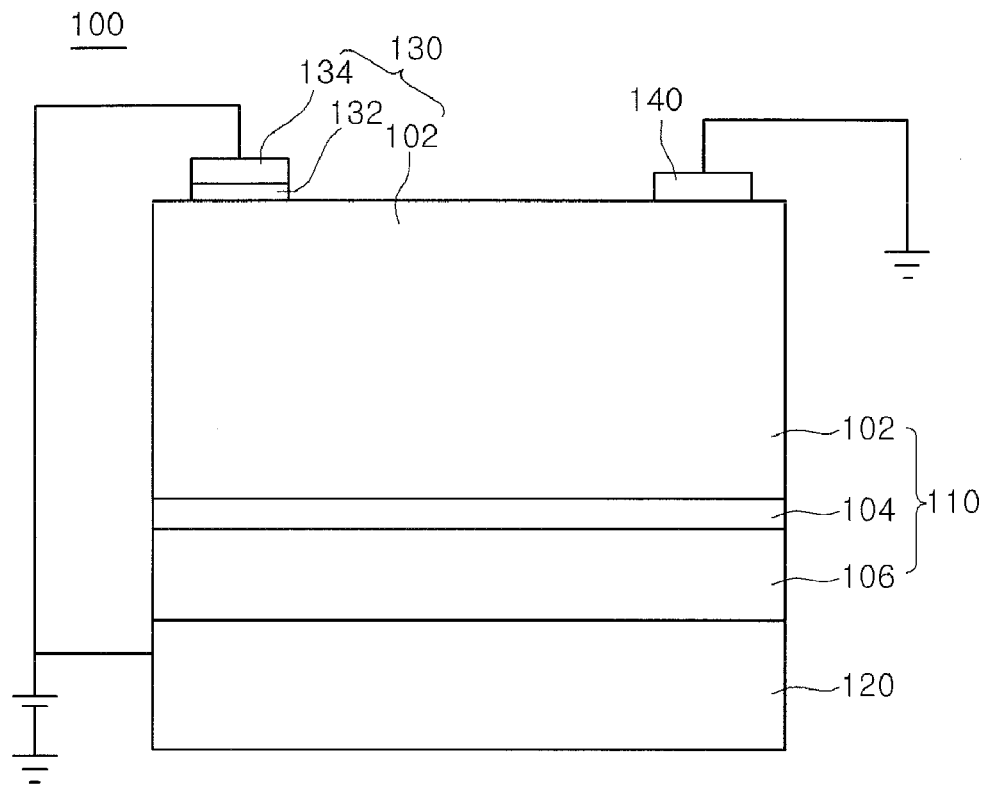
[FIG. 2a]
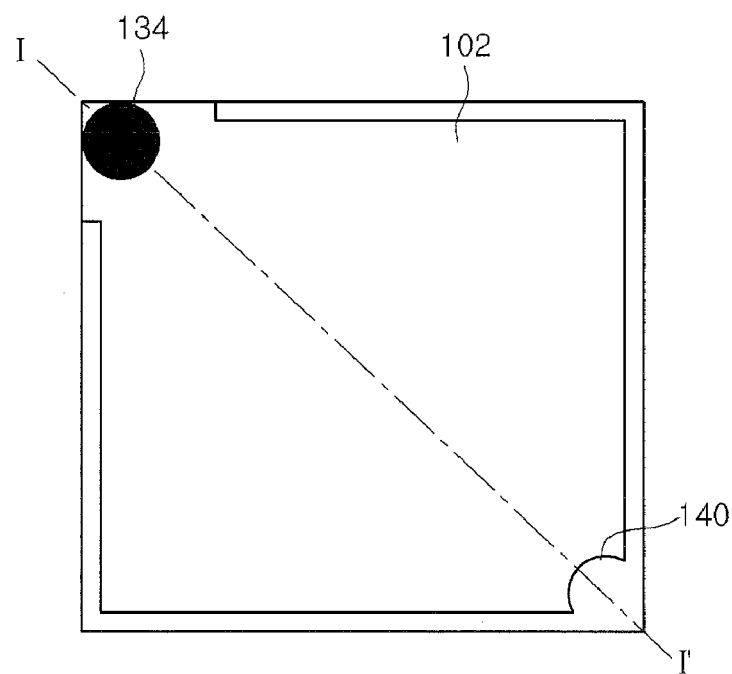

【FIG. 2b】
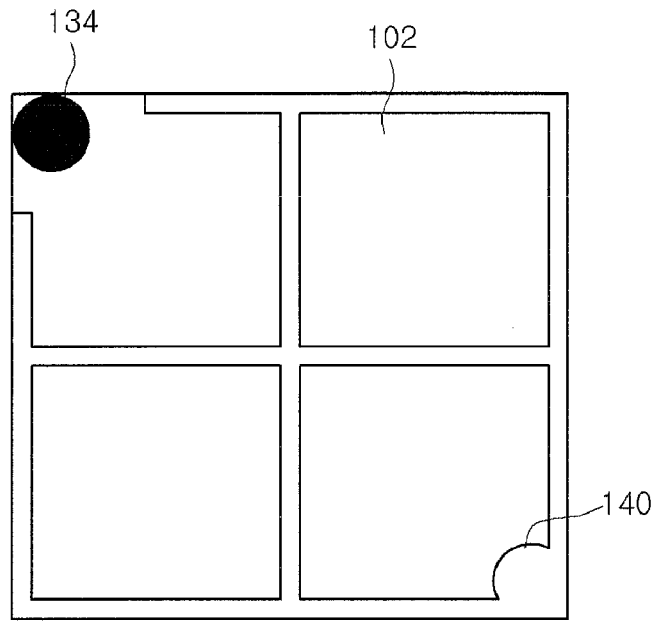
【FIG. 3】
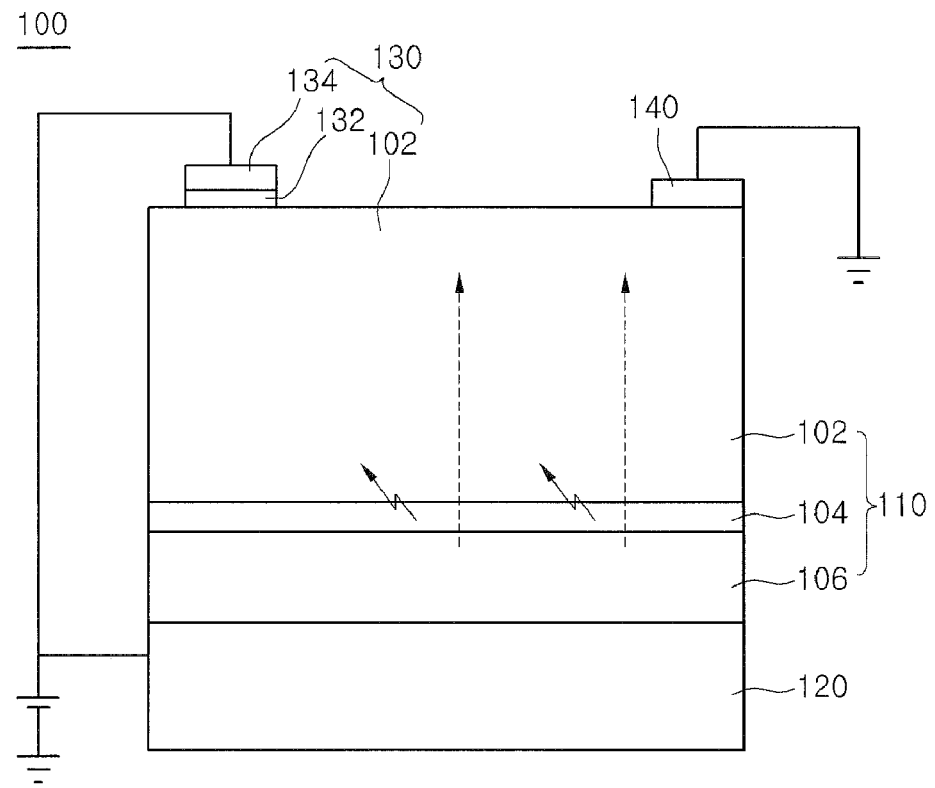

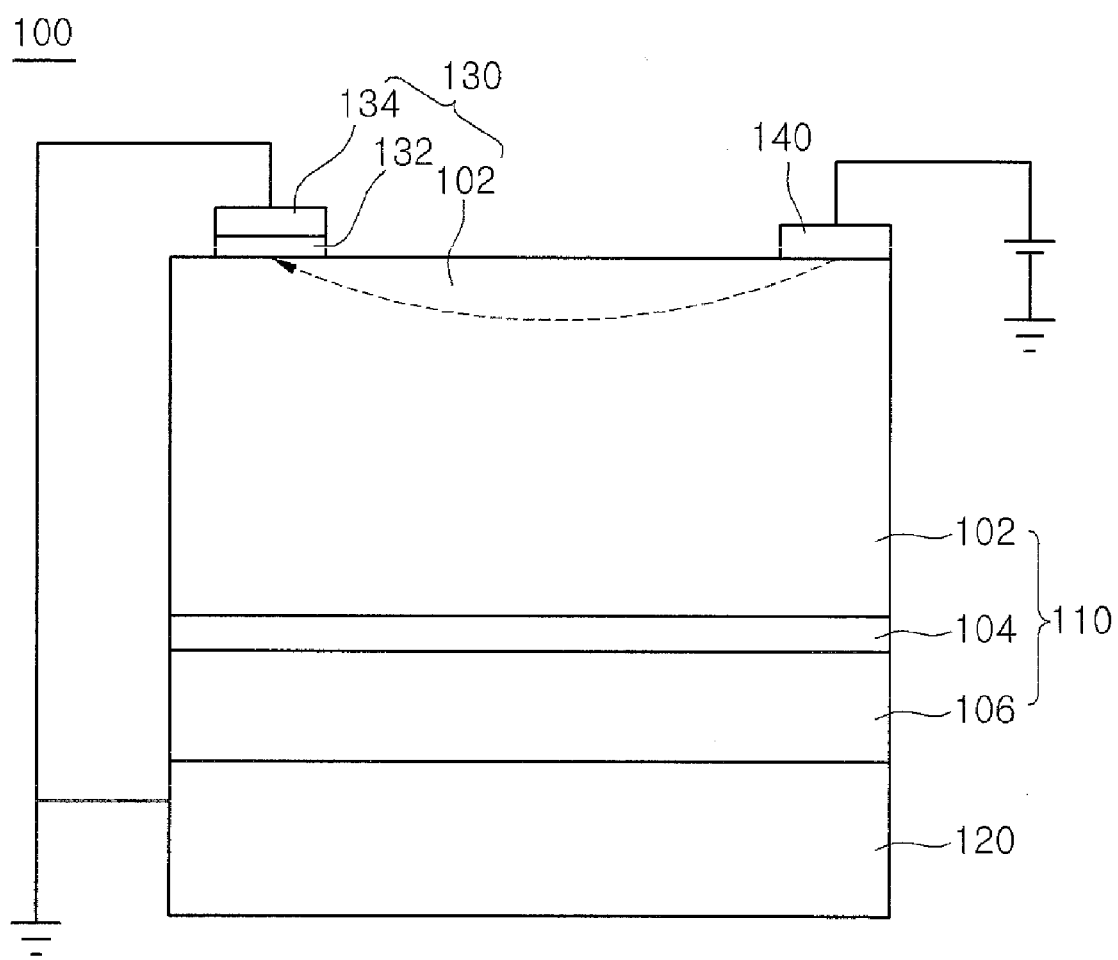
[FIG. 4]

【FIG. 5】
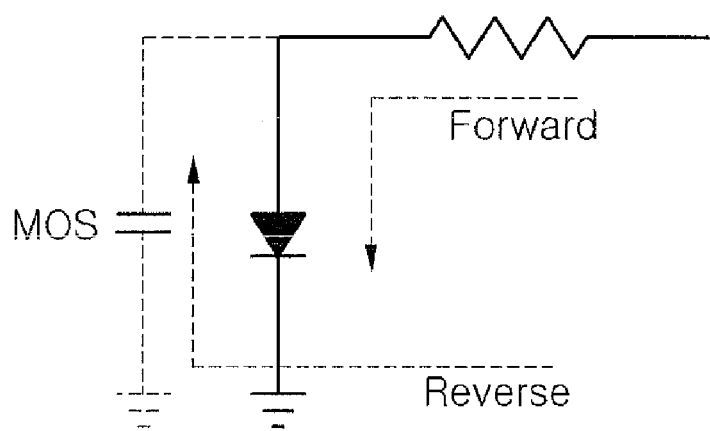
【FIG. 6】
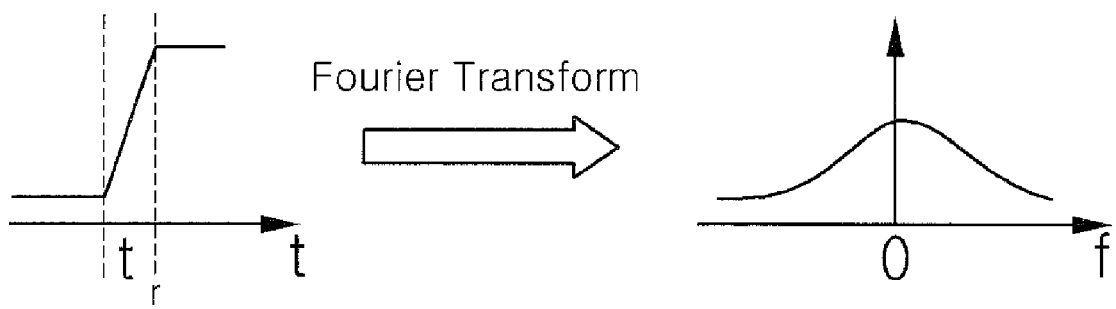

[FIG. 7]
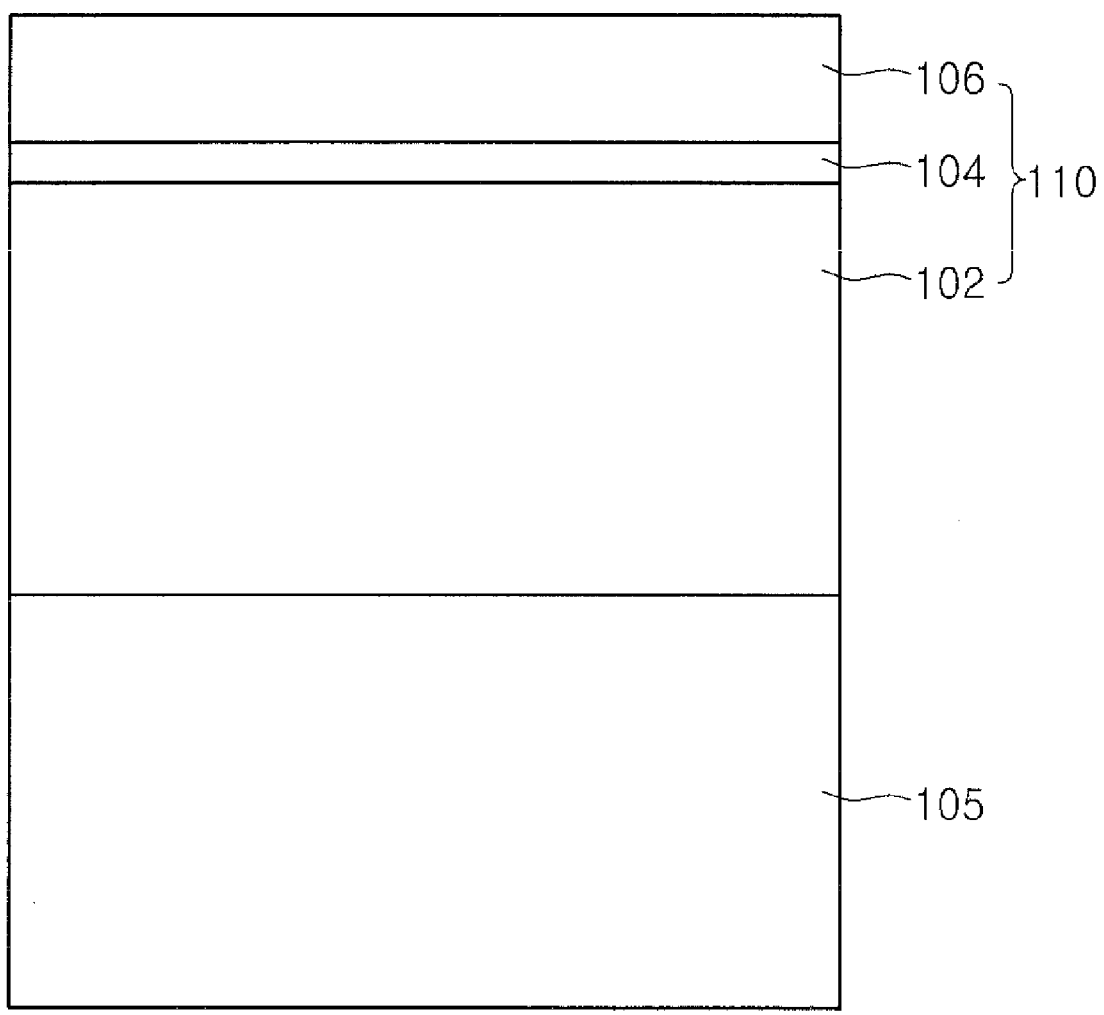

[FIG. 8]
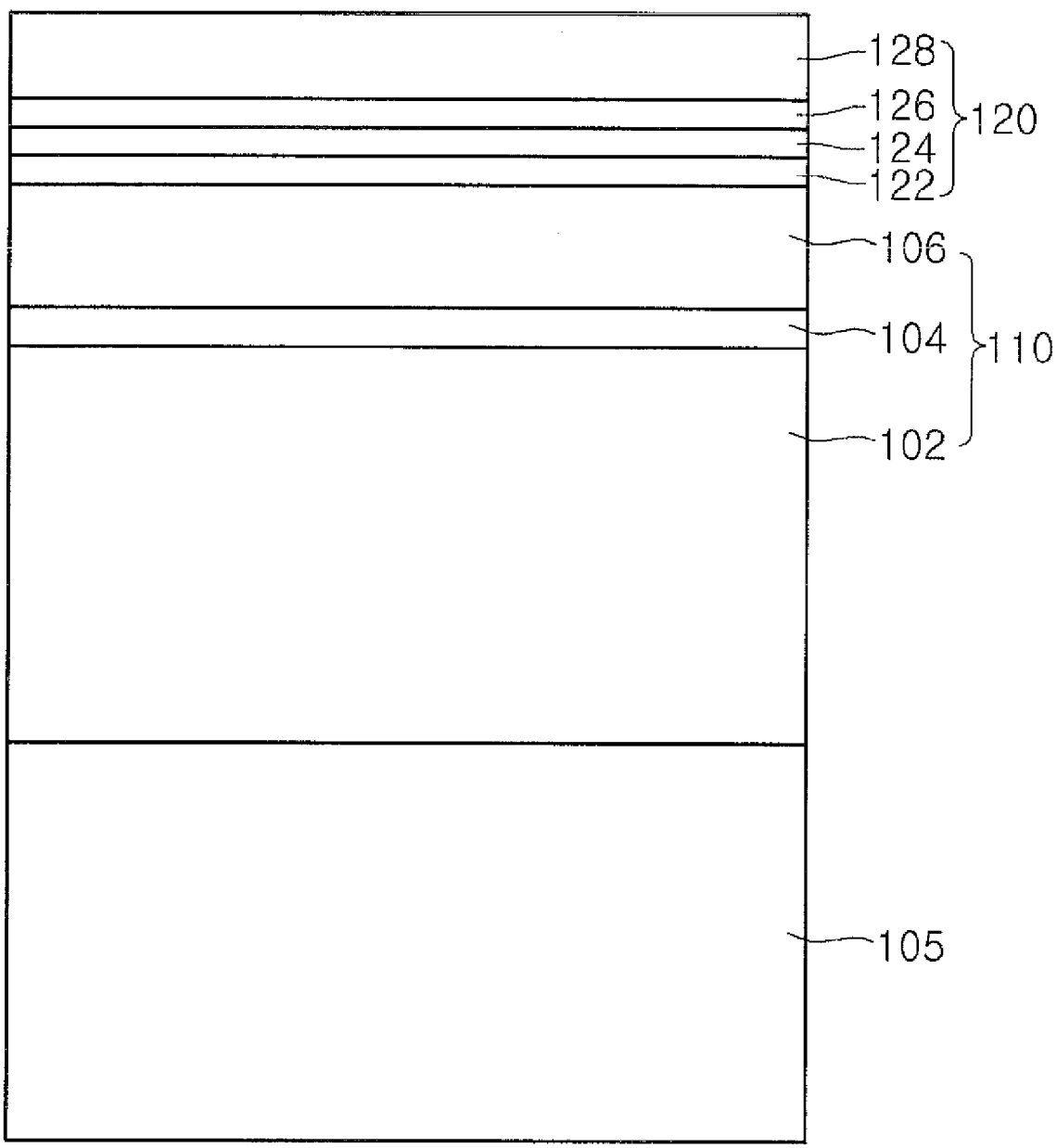

[FIG. 9]
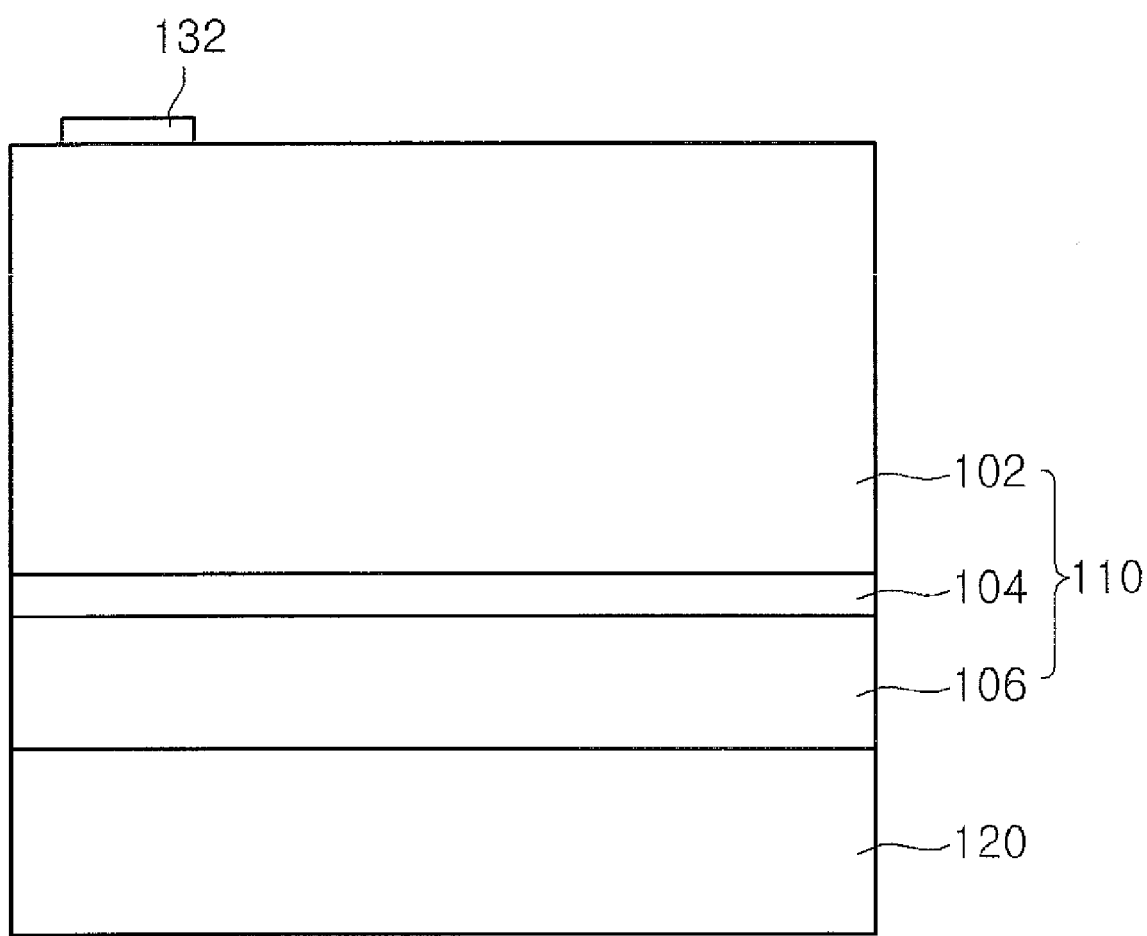

[FIG. 10]
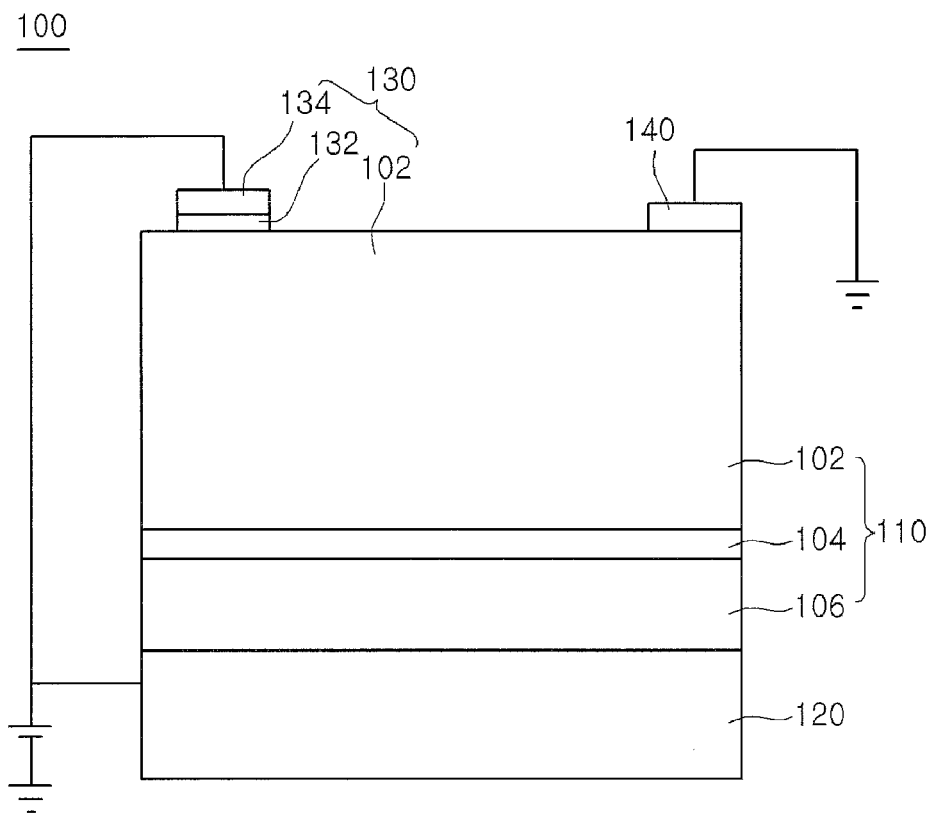
[FIG. 11]
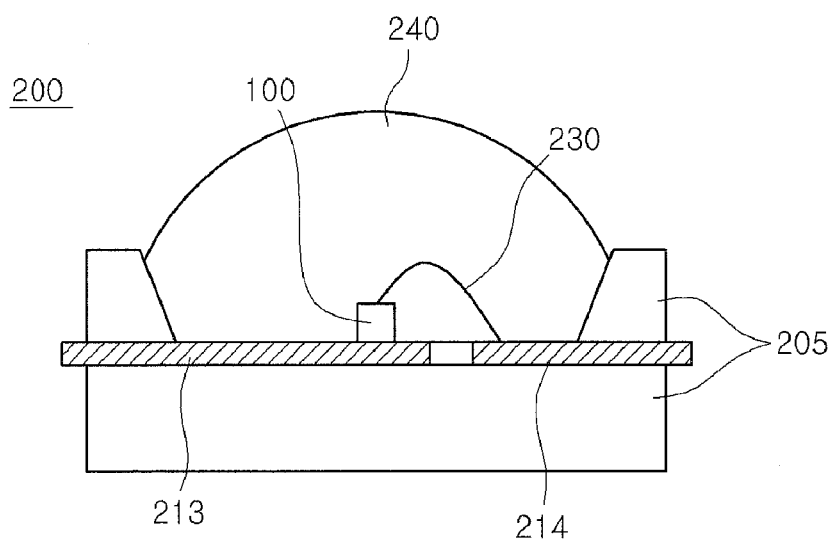

【FIG. 12】
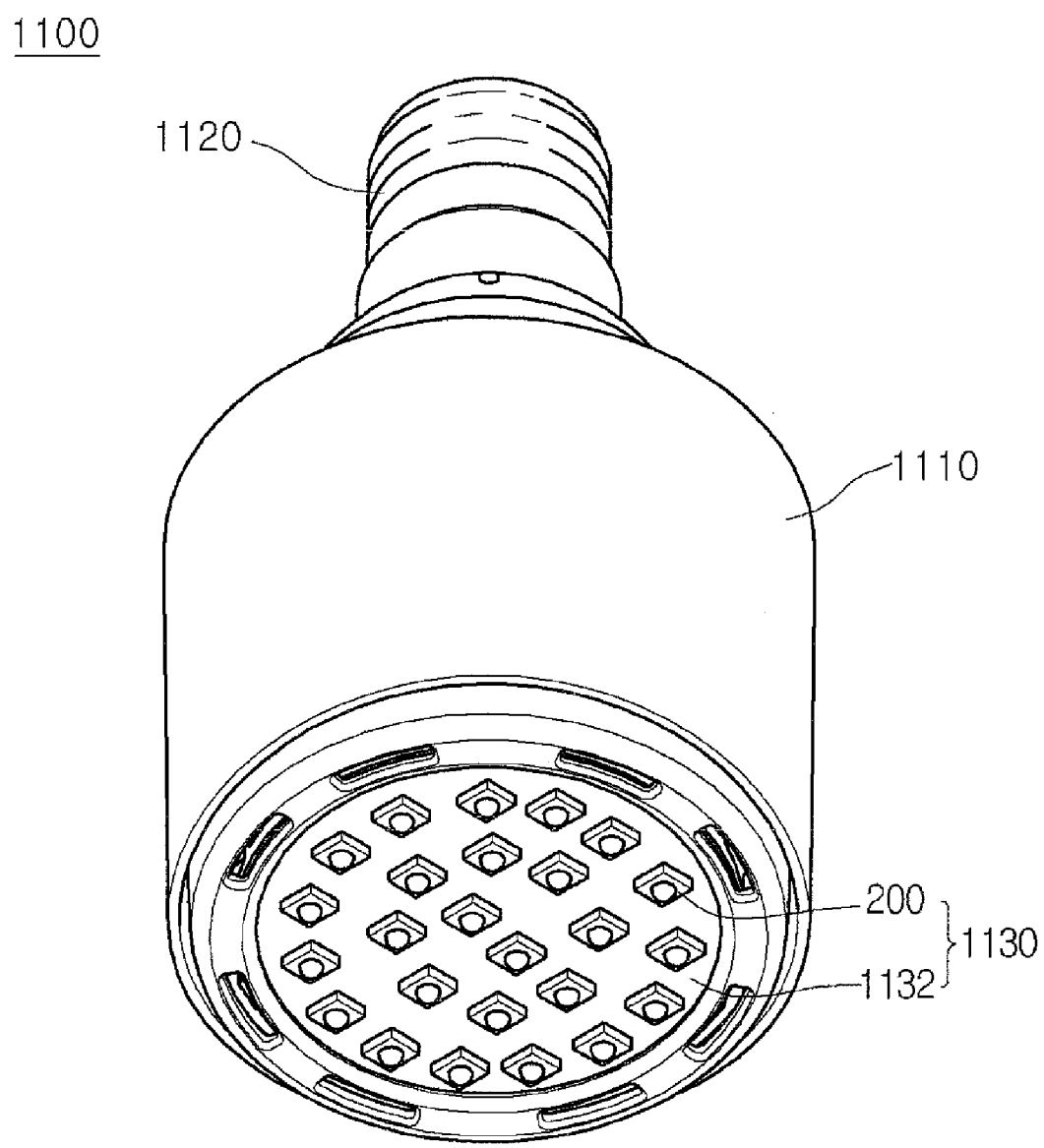

【FIG. 13】
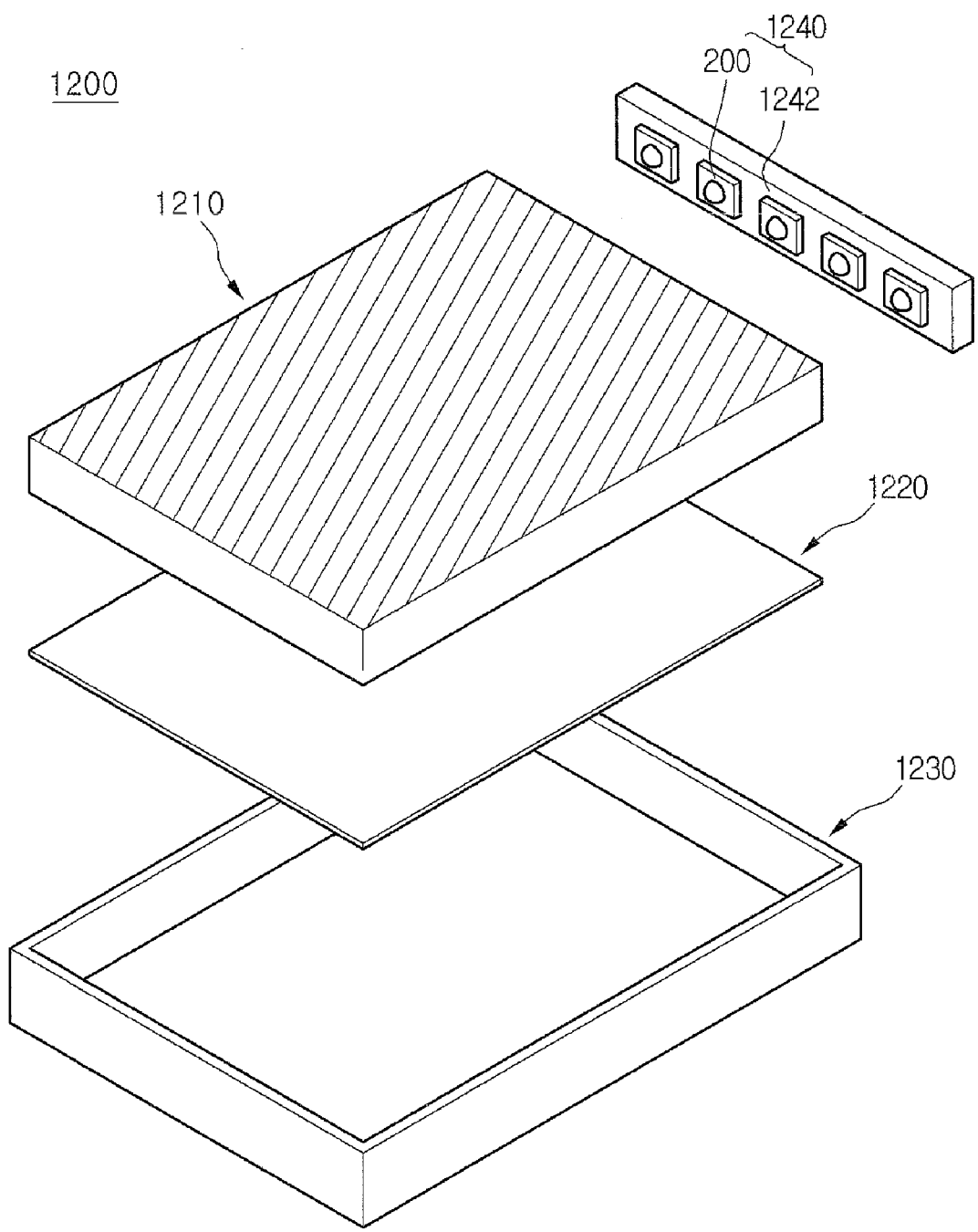

LIGHT EMITTING DEVICE, LIGHT EMITTING DEVICE PACKAGE AND LIGHTING SYSTEM

CROSS-REFERENCE TO RELATED APPLICATION

This application claims under 35 U.S.C. §119 to Korean Patent Application No. 10-2009-0100811, filed Oct. 22, 2009, which is hereby incorporated by reference in its entirety.

BACKGROUND

The embodiment relates to a light emitting device, a light emitting device package, and a lighting system.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

According to the related art, current may flow reversely when electrostatic discharge (ESD) occurs, thereby causing a damage to an active layer formed in a light emitting area.

In order to prevent the LED from being damaged by the ESD, according to the related art, a Zener diode is mounted in a package by connecting the Zener diode parallel to the package in the reverse direction of the LED. Thus, when constant voltage is applied, current flows to the LED so that the LED emits the light. In addition, when the ESD occurs, the current flows to the Zener diode so that the LED can be prevented from being damaged.

However, according to the related art, the Zener diode is mounted in the package, so that light absorption may be lowered.

BRIEF SUMMARY

The embodiment provides a light emitting device, a light emitting device package, and a lighting system, capable of preventing an LED from being damaged without causing loss of light absorption.

A light emitting device according to the embodiment includes a light emitting structure including a light emitting structure including a first conductive semiconductor layer, a second conductive semiconductor layer and an active layer between the first conductive semiconductor layer and the second conductive semiconductor layer; a dielectric layer over a first region of the first conductive semiconductor layer; a second electrode over the dielectric layer; and a first electrode over a second region of the first conductive semiconductor layer.

A light emitting device according to the embodiment includes a light emitting structure including a first conductive semiconductor layer, an active layer over the first conductive semiconductor layer, and a second conductive semiconductor layer over the active layer; a capacitor over a first region of the light emitting structure; and a first electrode over a second region of the first conductive semiconductor layer.

A light emitting device package according to the embodiment includes a package body; at least one electrode layer over the package body; and a light emitting device electrically connected to the electrode layer.

A lighting system according to the embodiment includes a light emitting module including a light emitting device package having a substrate and a light emitting device package over the substrate, wherein the light emitting device package includes a package body; at least one electrode layer over the package body; and a light emitting device electrically connected to the electrode layer.

BRIEF DESCRIPTION OF THE DRAWINGS

FIG. 1a, 1b are a sectional views showing a light emitting device according to the embodiment;

FIG. 2a, 2b are a plan views showing a light emitting device according to the embodiment;

FIG. 3 is a sectional view showing the operation of a carrier when constant voltage is applied to a light emitting device according to the embodiment;

FIG. 4 is a sectional view showing the operation of a carrier when the ESD occurs in a light emitting device according to the embodiment;

FIG. 5 is a circuit view of a light emitting device according to the embodiment;

FIG. 6 is a view showing a waveform when the ESD occurs in a light emitting device according to the embodiment;

FIGS. 7 to 10 are sectional views showing the method for manufacturing a light emitting device according to the embodiment;

FIG. 11 is a sectional view showing a light emitting device package according to the embodiment;

FIG. 12 is a perspective view showing a lighting unit according to the embodiment; and FIG. 13 is an exploded perspective view showing a backlight unit according to the embodiment.

DETAILED DESCRIPTION OF THE EMBODIMENTS

Hereinafter, a light emitting device, a light emitting device package, and a lighting system according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

FIG. 1a is a sectional view of a light emitting device according to the embodiment taken along line I-I' of FIG. 2a, and FIG. 2a is a plan view showing the light emitting device according to the embodiment.

The light emitting device 100 according to the embodiment includes a light emitting structure 110 having a first conductive semiconductor layer 102, an active layer 104 and a second conductive semiconductor layer 106. A dielectric layer 132 is formed on a first region of the first conductive semiconductor layer 102, a second electrode 134 formed on the dielectric layer 132, and a first electrode 140 is formed on a second region of the first conductive semiconductor layer 102.

According to the embodiment, the first conductive semiconductor layer 102, the dielectric layer 132 and the second electrode 134 may constitute a capacitor 130. When reverse voltage is applied, the reverse voltage flows from the first electrode 140 to the first conductive semiconductor layer 102.

According to the embodiment, a conductive substrate 120 is formed on the second conductive semiconductor layer 106. The second electrode 134 may be electrically connected to the conductive substrate 120 and may not be electrically connected to the first electrode 140.

FIG. 1a is for a vertical type LED, but the embodiment is not limited to the vertical type LED, the embodiment can be applied to the lateral type LED.

FIG. 2a is a plan views showing a light emitting device according to the embodiment, the first electrode 140 is extended to edge region of the first conductive semiconductor layer 102 and increases the light emitting area thereby. The first electrode 140 is not limited to the FIG. 2a and the first electrode 140 is not extended to edge region of the first conductive semiconductor layer 102 as FIG. 1b.

FIG. 2b is another plan views showing a light emitting device according to the embodiment, the first electrode 140 comprises a mesh shape and helps current spreading thereby.

According to the embodiment, a lateral current spreading can be increased by leveling a width of the first electrode 140. For example, a first width the first electrode 140 of closer region to pad electrode can be wider and a second width the first electrode 140 of far region to pad electrode can be thinner, and the lateral current spreading can be increased thereby.

The light emitting device according to the embodiment can prevent the LED from being damaged by the ESD without causing loss of light absorption.

FIG. 3 is a sectional view showing the operation of a carrier when constant voltage is applied to the light emitting device according to the embodiment, and FIG. 4 is a sectional view showing the operation of the carrier when the ESD occurs in the light emitting device 100 according to the embodiment.

According to the embodiment, when the constant voltage is applied as shown in FIG. 3, the carrier flows to the active layer so that the active layer emits the light. In addition, when the ESD occurs in the light emitting device 100 as shown in FIG. 4, high-frequency energy is applied to the dielectric layer so that the active layer can be protected.

That is, according to the embodiment, the dielectric layer is formed on a local area of the LED chip, and an electrode is formed on the dielectric layer, thereby forming the capacitor. Then, the electrode and the conductive substrate are electrically shorted, so that the current flows to the light emitting layer serving as an active area under the constant voltage. In addition, the high-frequency energy passes through the dielectric layer when the pulse type ESD occurs during the discharge operation, so that the light emitting layer can be protected.

In addition, according to the embodiment, the capacitor is formed in the LED chip to prevent damage caused by the ESD, so that the cost and process for manufacturing the package can be reduced and the loss of the light absorption can be minimized.

FIG. 5 is a circuit view of the light emitting device 100 according to the embodiment.

In FIG. 5, resistance connected to the LED is about 1.5 KΩ, which is similar to resistance of a human body, but the embodiment is not limited thereto.

According to the embodiment, the first conductive semiconductor layer 102, the dielectric layer 132 and the second electrode 134 may constitute the MOS (Metal/Oxide/Semiconductor) capacitor 130.

Thus, the light emitting device according to the embodiment may have the circuit as shown in FIG. 5. If forward voltage is applied under the constant voltage condition, the current flows through the LED so that the LED emits the light. In addition, if reverse voltage is applied due to the ESD, the current flows through the MOS capacitor 130.

That is, if the reverse voltage is applied according to the ESD, the current flowing to the active layer may be reduced as total capacitance $C_{Tot}$ is increased due to ESD stress, so that the impact can be attenuated.

This can be expressed by the equation as follows.

$Q_{Dis} = C_{ESD} V_{ESD}$ ($Q_{Dis}$ is amount of charges and $C_{ESD}$ is capacitance during discharge operation)

$C'_{Tot} = C_{Diode} + C_{MOS}$ (with MOS)

$C_{Tot} = C_{Diode}$ (without MOS)

$I = dQ/dt = \Delta Q/\tau = Q_{Dis}/(RC_{Tot}) \therefore C_{Tot}\uparrow \rightarrow I\downarrow$ $\therefore I' = Q_{Dis}/(RC') < I = Q_{Dis}/(RC_{Tot})$ In other words, if the reverse voltage is applied according to the ESD, the current I' flowing to the active layer may be reduced as total capacitance $C_{Tot}$ is increased due to ESD stress, so that the impact can be attenuated.

FIG. 6 is a view showing a waveform when the ESD occurs in the light emitting device according to the embodiment.

As shown in FIG. 6, the pulse waveform may have high-frequency components through Fourier transform. In addition, the high-frequency components are increased as the rising time $t_r$ is shortened.

As shown in the following equation, impedance caused by capacitance may be lowered as the frequency is increased. Thus, if the reverse voltage is applied due to the ESD, the impedance of the MOS capacitor is lowered, so that the high-frequency current flows to the MOS capacitor.

Impedance: $Z = Z_R + jZ_{Im}$ ($Z_R$ is real impedance, j is factor of imaginary part, and $Z_{Im}$ is impedance caused by capacitor), Capacitor: $Z_{Im,C} = 1/(j\omega C)$, ($\omega = 2\pi f$).

That is, when the reverse voltage is applied due to the ESD, the impedance of the MOS capacitor is lowered, so that the high-frequency current flows to the MOS capacitor.

The light emitting device according to the embodiment can prevent the LED from being damaged by the ESD without causing loss of light absorption.

That is, according to the embodiment, the dielectric layer is formed on a local area of the LED chip, and an electrode is formed on the dielectric layer, thereby forming the capacitor. Then, the electrode and the conductive substrate are electrically shorted, so that the current flows to the light emitting layer serving as an active area under the DC constant voltage. In addition, the high-frequency energy passes through the dielectric layer when the pulse type ESD occurs during the discharge operation, so that the light emitting layer can be protected.

In addition, according to the embodiment, the capacitor is formed in the LED chip to prevent damage caused by the ESD, so that the cost and process for manufacturing the package can be reduced and the loss of the light absorption can be minimized.

Hereinafter, the method for manufacturing the light emitting device according to the embodiment will be described with reference to FIGS. 7 to 10.

According to the embodiment, the light emitting device may include GaN, GaAs, GaAsP, or GaP. For instance, green-blue LEDs may include GaN (InGaN) and yellow-red LEDs may include InGaAlP or AlGaAs. In addition, full color can be realized by adjusting the composition of the above material.

First, the first substrate 105 is prepared as shown in FIG. 7. The first substrate 105 includes a conductive substrate or an insulating substrate. For instance, the first substrate 105 may include at least one of $Al_2O_3$, SiC, Si, GaAs, GaN, ZnO, Si, GaP, InP, Ge, and $Ga_2O_3$. A concave-convex structure can be formed on the first substrate 105, but the embodiment is not limited thereto.

The first substrate 105 can be subject to the wet cleaning to remove impurities from the surface of the first substrate 105.

Then, the light emitting structure 110 including the first conductive semiconductor layer 102, the active layer 104 and the second semiconductor layer 106 is formed on the first substrate 105.

For instance, the light emitting structure 110 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

A buffer layer (not shown) can be formed on the first substrate 105. The buffer layer may attenuate lattice mismatch between the light emitting structure 110 and the first substrate 105. The buffer layer may include the group III-V compound semiconductor. For instance, the buffer layer may include at least one of GaN, InN, AlN, InGaN, AlGaN, InAlGaN, and AlInN. An undoped semiconductor layer can be formed on the buffer layer, but the embodiment is not limited thereto.

The first conductive semiconductor layer 102 may include a group III-V compound semiconductor doped with a first conductive dopant. If the first conductive semiconductor layer 102 is an N type semiconductor layer, the first conductive dopant is an N type dopant, such as Si, Ge, Sn, Se, or Te, but the embodiment is not limited thereto.

The first conductive semiconductor layer 112 may include semiconductor material having the compositional formula of $In_xAl_yGa_{1-x-y}N$ ($0 \leq x \leq 1$, $0 \leq y \leq 1$, $0 \leq x+y \leq 1$).

In addition, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 102 may include an N type GaN layer, which is formed through the CVD, MBE, sputtering or HVPE. In addition, the first conductive semiconductor layer 102 can be formed by injecting trimethyl gallium (TMGa) gas, ammonia ($NH_3$) gas, nitrogen ($N_2$) gas and silane ($SiH_4$) gas including n type impurities, such as silicon, into the chamber.

Then, the active layer 104 is formed on the first conductive semiconductor layer 102.

Electrons injected through the first conductive semiconductor layer 102 meet holes injected through the second conductive semiconductor layer 106 at the active layer 104, so that the active layer 104 can emit the light having energy determined based on the intrinsic energy band of the active layer (light emitting layer) 104.

The active layer 104 may include at least one of a single quantum well structure, a multiple quantum well (MQW) structure, a quantum wire structure and a quantum dot structure. For instance, the active layer 104 can be formed with the MQW structure by injecting TMGa gas, $NH_3$ gas, $N_2$ gas, and trimethyl indium (TMIn) gas, but the embodiment is not limited thereto.

The active layer 104 may have a well/barrier layer including at least one of InGaN/GaN, InGaN/InGaN, AlGaN/GaN, InAlGaN/GaN, GaAs/AlGaAs(InGaAs) and GaP/AlGaP(InGaP), but the embodiment is not limited thereto. The well layer may include material having the band gap energy lower than that of the barrier layer.

A conductive clad layer (not shown) can be formed on and/or under the active layer 104. The conductive clad layer may include an AlGaN-based semiconductor having the band gap energy higher than that of the active layer 104.

Then, the second conductive semiconductor layer 106 is formed on the active layer 104.

The second conductive semiconductor layer 106 includes the group III-V compound semiconductor doped with the second conductive dopant. For instance, the second conductive semiconductor layer 106 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 106 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 106 is a P type semiconductor layer, the second conductive dopant includes the P type dopant such as Mg, Zn, Ca, Sr, or Ba. The second conductive semiconductor layer 106 can be prepared as a single layer or a multiple layer, but the embodiment is not limited thereto.

The second conductive semiconductor layer 106 may include a p type GaN layer, which can be formed by injecting TMGa gas, $NH_3$ gas, $N_2$ gas and $(EtCp_2Mg)\{Mg(C_2H_5C_5H_4)_2\}$ gas including p type impurities (for example, Mg) into the chamber, but the embodiment is not limited thereto.

According to the embodiment, the first conductive semiconductor layer 102 may include an N type semiconductor layer and the second conductive semiconductor layer 106 may include a P type semiconductor layer, but the embodiment is not limited thereto. In addition, a semiconductor layer, such as an N type semiconductor layer (not shown) having polarity opposite to that of the second conductive semiconductor layer 106, can be formed on the second conductive semiconductor layer 106. Thus, the light emitting structure 110 may include one of an N-P junction structure, a P-N junction structure, an N-P-N junction structure, and a P-N-P junction structure.

After that, as shown in FIG. 8, the second electrode layer 120 is formed on the second conductive semiconductor layer 106.

The second electrode layer 120 may include a second ohmic layer 122, a reflective layer 124, a junction layer and a conductive support substrate 128.

For instance, the ohmic layer 122 of the second electrode layer 120 comes into ohmic contact with the light emitting structure 110 to easily supply power to the light emitting structure 110. The ohmic layer 122 can be prepared as a multiple layer by stacking single metal, a metal alloy, and metal oxide.

For instance, the ohmic layer 122 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the second electrode layer 120 may include the reflective layer 124 to reflect the light incident from the light emitting structure 110, thereby improving the light extraction efficiency.

For instance, the reflective layer 124 may include metal or a metal alloy including at least one selected from the group consisting of Ag, Ni, Al, Rh, Pd, Ir, Ru, Mg, Zn, Pt, Au, and Hf. In addition, the reflective layer 124 can be prepared as a multiple layer by using the above metal or metal alloy and transmissive conductive material, such as IZO, IZTO, IAZO, IGZO, IGTO, AZO, or ATO. For instance, the reflective layer 124 may have the stack structure including IZO/Ni, AZO/Ag, IZO/Ag/Ni, or AZO/Ag/Ni.

In addition, if the second electrode layer 120 includes the junction layer 126, the reflective layer 124 may serve as a bonding layer or may include barrier metal or bonding metal. For instance, the junction layer 126 may include at least one selected from the group consisting of Ti, Au, Sn, Ni, Cr, Ga, In, Bi, Cu, Ag and Ta.

The second electrode 120 includes the conductive support substrate 128. The conductive support substrate 128 supports the light emitting structure 110 to provide power to the light emitting structure 110. The conductive support substrate 128 may include metal having superior electric conductivity, a metal alloy or conductive semiconductor material.

The conductive support substrate 128 may include at least one selected from the group consisting of Cu, a Cu alloy, Au, Ni, Mo, Cu—W, and a carrier wafer, such as Si, Ge, GaAs, GaN, ZnO, SiGe, and SiC.

The conductive support substrate 128 may have a thickness of about 30 μm to 500 μm which may vary depending on the design rule of the light emitting device.

The conductive support substrate 128 can be formed through the electrochemical metal deposition scheme, the plating scheme or the bonding scheme using eutectic metal.

Then, as shown in FIG. 9, the first substrate 105 is removed such that the first conductive semiconductor layer 102 can be exposed. The first substrate 105 can be removed through the laser lift off scheme or the chemical lift off scheme. In addition, the first substrate 105 can be removed by physically grinding the first substrate 105.

Then, the dielectric layer 132 is formed on the first region of the first conductive semiconductor layer 102. The dielectric layer 132 may include an oxide layer or a nitride layer, such as $SiO_2$, $TiO_2$, $Al_2O_3$, $Si_3N_4$, $SrBi_2(Ta, Nb)_2O_9$(SBT), $Pb(Zr,Ti)O_3$(PZT), $Bi_4Ti_3O_{12}$(BTO) but the embodiment is not limited thereto. The dielectric layer 132 can be a ferroelectric material and High capacity can be obtained even though the width is thin.

For instance, a first pattern (not shown) for exposing the first region of the first conductive semiconductor layer 102 is formed, and the dielectric layer 132 is formed on the exposed first region of the first conductive semiconductor layer 102 by using the first pattern as a mask. Then, the first pattern is removed.

Otherwise, the dielectric layer is formed over the whole area of the first conductive semiconductor layer 102 and a second pattern (not shown) blocking the first region is formed. Then, the dielectric layer formed on the first conductive semiconductor layer other than the first region is removed by using the second pattern as a mask, thereby forming the dielectric layer 132 on the first region. Then, the second pattern is removed.

After that, as shown in FIG. 10, a third electrode 134 is formed on the dielectric layer 132 and the first electrode 140 is formed on the second region of the first conductive semiconductor layer 102.

The first electrode 140 includes a pad section subject to the wire bonding, and a finger section extending from the pad section. The finger section may branch into a predetermined pattern. The finger section may have various shapes.

The first and third electrodes 140 and 134 can be sequentially or simultaneously formed.

In addition, the first and third electrodes 140 and 134 may have the same material.

For instance, after forming a third pattern for exposing the first and second regions where the first and third electrodes 140 and 134 are formed, electrode material is formed on the first and second regions by using the third pattern as a mask, so that the first and third electrodes 140 and 134 can be simultaneously formed by using the same material. Then, the third pattern is removed.

After that, the third electrode 134 is electrically connected to the second electrode 120.

According to the light emitting device and the method for manufacturing the same of the embodiment, the LED can be prevented from being damaged by the ESD without causing loss of light absorption.

That is, according to the embodiment, the dielectric layer is formed on a local area of the LED chip, and an electrode is formed on the dielectric layer, thereby forming the capacitor. Then, the electrode and the conductive substrate are electrically shorted, so that the current flows to the light emitting layer serving as an active area under the DC constant voltage. In addition, the high-frequency energy passes through the dielectric layer when the pulse type ESD occurs during the discharge operation, so that the light emitting layer can be protected.

In addition, according to the embodiment, the capacitor is formed in the LED chip to prevent damage caused by the ESD, so that the cost and process for manufacturing the package can be reduced and the loss of the light absorption can be minimized.

FIG. 11 is a view showing a light emitting device package 200 including the light emitting device according to the embodiments.

Referring to FIG. 11, the light emitting device package 200 includes a package body 205, fifth and sixth electrode layers 213 and 214 formed on the package body 205, the light emitting device 100 provided on the package body 205 and electrically connected to the fifth and sixth electrode layers 213 and 214 and a molding member 240 that surrounds the light emitting device 100.

The package body 205 may include silicon, synthetic resin or metallic material. An inclined surface may be formed around the light emitting device 100.

The fifth and sixth electrode layers 213 and 214 are electrically isolated from each other to supply power to the light emitting device 100. In addition, the fifth and sixth electrode layers 213 and 214 reflect the light emitted from the light emitting device 100 to improve the light efficiency and dissipate heat generated from the light emitting device 100 to the outside.

The vertical type light emitting device shown in FIG. 1 can be employed as the light emitting device 100, but the embodiment is not limited thereto. For instance, the lateral type light emitting device can be used as the light emitting device 100.

The light emitting device 100 can be installed on the package body 205 or the fifth and sixth electrode layers 213 and 214.

The light emitting device 100 is electrically connected to the fifth electrode layer 213 and/or the sixth electrode layer 214 through at least one of a wire bonding scheme, a flip chip bonding scheme and a die bonding scheme. According to the embodiment, the light emitting device 100 is electrically connected to the fifth electrode layer 213 through a wire 230 and electrically connected to the sixth electrode layer 214 through the die bonding scheme.

The molding member 240 surrounds the light emitting device 100 to protect the light emitting device 100. In addition, the molding member 240 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

FIG. 12 is a perspective view showing a lighting unit 1100 according to the embodiment. The lighting unit 1100 shown in FIG. 12 is an example of a lighting system and the embodiment is not limited thereto.

Referring to FIG. 12, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes metallic material or resin material.

The light emitting module 1130 may include a substrate 1132 and at least one light emitting device package 200 installed on the substrate 1132.

The substrate 1132 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 200 can be installed on the substrate 1132. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1130 can be variously arranged to provide various colors and brightness. For instance, the white LED, the red LED and the green LED can be arranged to achieve the high color rendering index (CRI).

The connection terminal 1120 is electrically connected to the light emitting module 1130 to supply power to the light emitting module 1130. Referring to FIG. 12, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

FIG. 13 is an exploded perspective view showing a backlight unit 1200 according to the embodiment. The backlight unit 1200 shown in FIG. 13 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate 2110, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged such that light exit surfaces of the light emitting device packages 200 are spaced apart from the light guide plate 1210 by a predetermined distance.

The reflective member 1220 is disposed below the light guide plate 1210. The reflective member 1220 reflects the light, which is traveled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, the lighting system according to the embodiment includes the light emitting device package, so that the reliability of the lighting system can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
   a light emitting structure having a first conductive type semiconductor layer, an active layer, and a second conductive type semiconductor layer;
   a dielectric layer in a first area of the first conductive type semiconductor layer;
   a second electrode on the dielectric layer;
   a first electrode in a second area of the first conductive type semiconductor layer;
   a conductive substrate on the second conductive type semiconductor layer;
   wherein the second electrode and the conductive substrate are electrically connected to each other.

2. The light emitting device according to the claim 1, wherein the first electrode and the second electrode are not electrically connected to each other.

3. The light emitting device according to the claim 1, wherein a current passes through the active layer to generate light in constant voltage, and a electrostatic passes through the dielectric layer in electrostatic discharge.

4. A light emitting device comprising:
   a light emitting structure having a first conductive type semiconductor layer, an active layer, and a second conductive type semiconductor layer;
   a capacitor in a first area of the light emitting structure, wherein the capacitor comprises a dielectric layer in a first area of the first conductive type semiconductor layer and a second electrode on the dielectric layer;
   a first electrode in a second area of the first conductive type semiconductor layer;
   a conductive substrate on the second conductive type semiconductor layer;
   wherein the second electrode and the conductive substrate are electrically connected to each other.

5. The light emitting device according to the claim 4, wherein the first electrode and the second electrode are not electrically connected to each other.

6. The light emitting device according to the claim 4, wherein a current passes through the active layer to generate light in constant voltage, and a high frequency passes through the capacitor in electrostatic discharge.

* * * * *